United States Patent [19]

Steele

[11] Patent Number: 4,880,997
[45] Date of Patent: Nov. 14, 1989

[54] LOW NOISE OUTPUT BUFFER CIRCUIT

[75] Inventor: David P. Steele, Colorado Springs, Colo.

[73] Assignee: NCR Corporation, Dayton, Ohio

[21] Appl. No.: 233,506

[22] Filed: Aug. 18, 1988

[51] Int. Cl.[4] .................. H03K 17/16; H03K 19/094; H03K 5/13

[52] U.S. Cl. .................................... 307/443; 307/451; 307/473; 307/263; 307/264

[58] Field of Search ............... 307/443, 448, 451, 473, 307/263, 264

[56] References Cited

U.S. PATENT DOCUMENTS

| | | | |
|---|---|---|---|
| 4,612,466 | 9/1986 | Stewart | 307/270 |
| 4,777,389 | 10/1988 | Wu et al. | 307/443 |
| 4,779,013 | 10/1988 | Tanaka | 307/443 |
| 4,783,601 | 11/1988 | Hartgring et al. | 307/246 |
| 4,785,201 | 11/1988 | Martinez | 307/443 |
| 4,825,099 | 4/1989 | Barton | 307/270 |
| 4,827,159 | 5/1989 | Naganuma | 307/443 |

Primary Examiner—Stanley D. Miller
Assistant Examiner—Margaret Rose Wambach
Attorney, Agent, or Firm—Wilbert Hawk, Jr.; Casimer K. Salys

[57] ABSTRACT

A buffer circuit with controlled output switching rate suitable to suppress ground or power supply line voltage spikes attributable to current surges. The voltage driving the gate electrode of the selected CMOS inverter output transistor is controlled in rate of rise using three parallel connected sources of charging current. The first source of current is enabled immediately following the step input signal to provide a relatively high initial rate of current flow and corresponding voltage rise on the gate electrode of the output transistor, but is self-disabled at approximately half the supply voltage by threshold loss and body effect on the transistor supplying the first source of current. The succeeding time interval is characterized by a slow rate of rise of the output transistor gate voltage attributable to a small but continuous source of current to the output transistor gate electrode node. The concluding interval is characterized by a high rate of current flow to the gate electrode node, but is enabled by feedback responsive to having the output node approach the final logic level. The circuit is suitable for suppressing both ground line and power supply line voltage spikes, and is further capable of being implemented in a tri-state configuration with minimum added complexity.

10 Claims, 3 Drawing Sheets

LOW NOISE OUTPUT BUFFER CIRCUIT

CROSS REFERENCE TO RELATED APPLICATIONS

The subject matter herein relates generally invention described in U.S. Pat. No. 4,829,199, issued May 9, 1989, and assigned to the assignee of the present invention.

BACKGROUND OF THE INVENTION

The present invention involves an electronic circuit for buffering binary state signals. More particularly, the invention prescribes a buffer circuit which effectively drives an output pad of a CMOS integrated circuit device while suppressing switching noise spikes on the supply voltage and ground lines of the device.

Integrated circuits have evolved to a level where the switching speeds of the logic field effect transistors are now so fast that the distributed inductances of the ground line as well as the power supply line produce voltage spikes of considerable magnitudes. As the device geometries and operating voltages decrease, logic circuits on such integrated circuits become even more susceptible to voltage spikes. Consequently, there has appeared a growing need for integrated circuit logic switching circuits which are capable of handling conventional current levels yet provide switching transitions which do not produce significant voltage spikes on either the ground or the power supply bus lines.

A number of techniques for controlling switching transients have been considered and likely implemented. One such approach is described in U.S. Pat. No. 4,129,792, wherein parallel driver transistors are enabled in fixed time delay succession to incrementally elevate the level of output current. The invention in U.S. Pat. No. 4,628,218 proposes the use of a parallel transistor, drawing current from a supplemental capacitor in lieu of the power supply line, to temporarily provide an elevated level of current to the output line. The successive enablement of parallel connected transistors is also central to the invention described in U.S. Pat. No. 4,638,187, here implemented in the context of cascaded CMOS inverter stages. U.S. Pat. No. 4,727,266, teaches that the rate of change of current in the output can be limited by undersizing the input stage drivers in relation to the capacitive load on the input node to the final inverter stage. Control of the output waveform to limit switching noise is also the subject of U.S. Pat. No. 4,731,553, in this case including the further refinement of having multiple power supplies for individual use by the successive driver stages. Using a current sink to time limit the supply voltage available at an input amplifier stage is the subject of U.S. Pat. No. 4,739,193. Sizing of the predriver stages to control output noise and match characteristic impedance is the subject of an article authored by Knight, Jr. et al., entitled "A Self-Terminating Low-Voltage Swing CMOS Output Driver" which appeared in the April 1988 issue of *IEEE Journal of Solid-State Circuits*. The paper entitled "Controlled Slow Rate Output Buffer" by Leung as appeared in the published proceedings of the IEEE 1988 Custom Integrated Circuits Conference, pages 5.51–5.54, describes a technique with features similar to the aforemention copending patent application. Also of potential interest is the switching noise suppression subject matter in U.S. Pat. Nos. 4,719,369 and 4,408,135.

The concept of body effect as related to the operating characteristics of a field effect transistors formed in a common substrate is relatively well known by those who routinely practice in the art. For instance, see the discussion which appears in Chapter 2.1.5 of the textbook entitled *Principles of CMOS VLSI Design*, authored by Weste et al., and published by Addison-Wesley with a copyright date of 1985.

TTL/CMOS interface circuits to control the characteristics of an output buffer are the subject of U.S. Pat. No. 4,437,024. Therein, parallel connected transistors of various widths are implemented to constrain terminal potentials within defined threshold and logic bands.

Though the various references bear upon the control of an output driver transistor or inverter pair, the variations, if nothing else, suggest that solutions to the problem of power supply and ground line spikes have yet to be eliminated in any routine or commonly practiced manner.

SUMMARY OF THE INVENTION

Voltage spikes attributable to CMOS logic switching transients and appearing on the ground bus or power supply bus lines of integrated circuit chip products are materially reduced or suppressed using a circuit which controls the rate of change of the voltage on the gate electrode of the switched field effect output transistor. The slope of the voltage used to drive the output transistor is controlled by incrementally adjusting the drive current to the node capacitance of the pull-down transistor gate electrode while the compliment transistor of the inverter pair is driven directly by the input signal.

As preferably implemented, the voltage furnished to the gate electrode node is composed of three distinguishable operating states. The first state arises when the node is provided current in direct relation to the input signal, using a transistor with significant current conduction capability but subject to threshold loss and body effect current limitations. The transistor furnishing the first increment of current transitions from an initial saturated mode of operation into a cutoff mode as the gate electrode node of the output transistor moves from zero to approximately one half the supply voltage. Thereafter, and dominating the second operating state, a second field effect transistor of complementary arrangement to the first continues to charge the node but at a significantly lower rate of current flow. As the output transistor gate electrode node voltage approaches the level of the supply voltage, the third state is initiated to provide a supplemental source of current to the node through a third field effect transistor of relatively large current conduction capability. The third transistor is responsive to a feedback signal from the output node of the composite amplifier. As a consequence of the current furnished during the third state, the gate electrode node of the pull-down output transistor is further driven and pulled up to the full voltage of the power supply.

The ground and supply voltage lines spikes associated with output transistor switching transients are substantially suppressed without materially degrading the steady state current drive at the output node or materially delaying the rise or fall time of the switched voltage at the output node.

The circuit of the present invention may be implemented in a tri-state configuration, and thereby made suitable for selective enablement of the output drive. The tri-state version uses logic to combine the input signal with the enablement signal in controlling the pull-up transistor of the output inverter pair. Logic is used to selectively enable the transistors contributing the controlled current to the gate electrode node of the pull-down transistor.

As a further potential refinement in providing tri-state capability, logic circuitry may be used to combine the binary state information at the gate electrode of the pull-down transistor with the binary state of the output node of the inverter to avoid premature enablement when the output is subject to a float, precharge or external bias voltage condition.

These and other features of the invention will be more clearly understood and appreciated upon considering the detailed embodiment as set forth hereinafter.

DESCRIPTION OF THE PREFERRED EMBODIMENT

Figure 1:
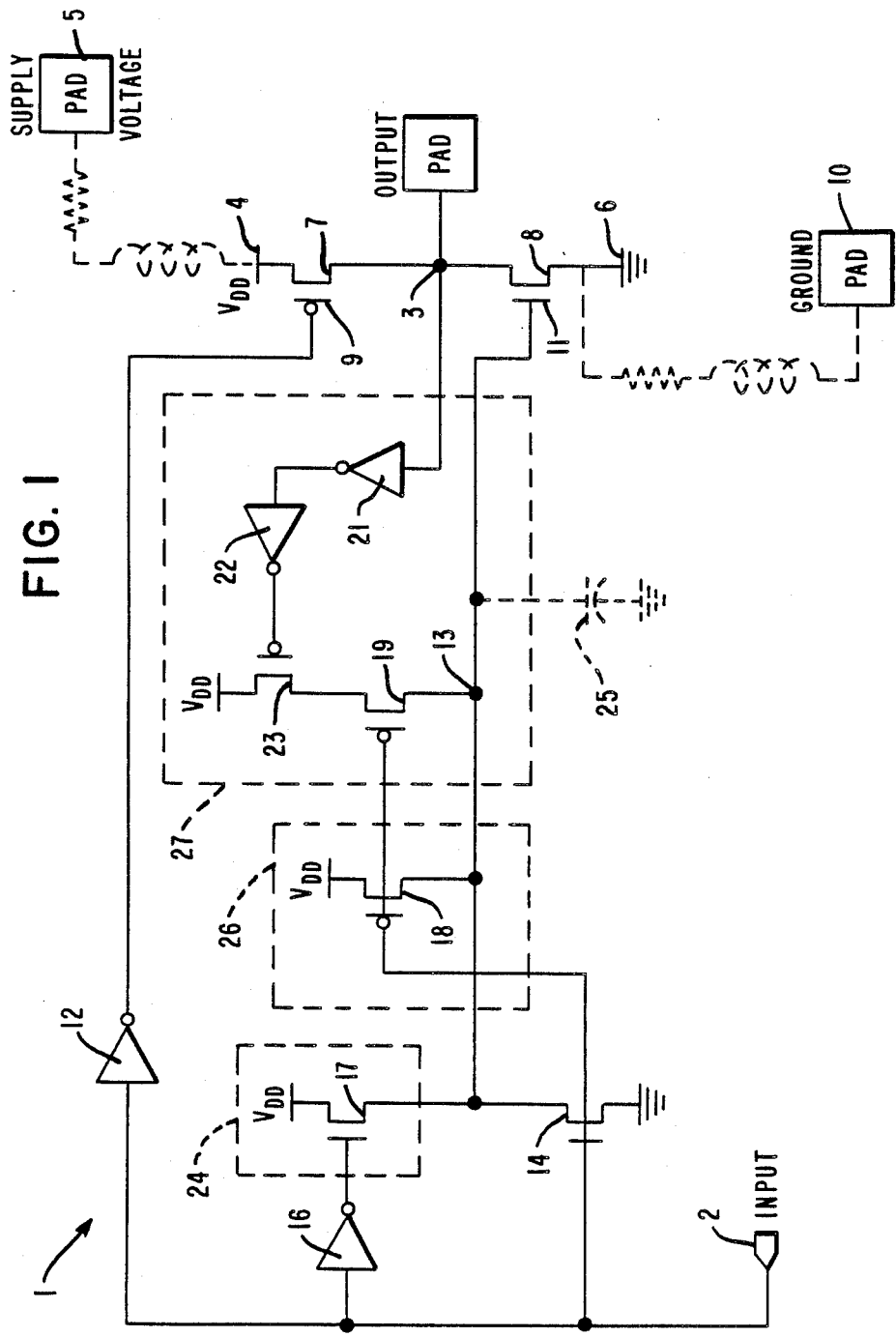
FIG. 1 schematically illustrates a basic circuit embodying the features of the invention.

Attention is directed to FIG. 1 of the drawings where circuit 1 schematically illustrates a representative embodiment of the present invention using CMOS field effect transistors in a grounded substrate application. The depicted amplifier is configured as a buffer to drive the output pad of an integrated circuit chip. The signals furnished to input line 2 are digital in format.

The circuit embodied in FIG. 1 is designed to provide ground line voltage spike suppression for input signals which transition from an initial high state to a concluding low state. For this transition of the input voltage, output pad node 3 is also pulled to a low voltage level. A complementary arrangement of the circuit, for suppressing power supply line voltage spikes for low to high transitions of the output voltage, can be implemented with relative ease once the functions of the invention are understood. Accordingly, this arrangement will not be explicitly shown or described.

The output pad amplifier/buffer circuit in FIG. 1 uses relatively large current capacity field effect transistors 7 and 8 to drive output pad node 3. The transistors are configured as an inverter pair connected in electrical series between voltage supply line node 4 and ground line node 6. Note that such nodes 4 and 6 are merely intermediate connections to internal buses which themselves exhibit inductive and resistive characteristics between such nodes 4 and 5 and the respective pads 5 and 10 at which the voltage levels are actually established.

Output pad node 3 is situated between p-channel field effect transistor 7 and n-channel transistor 8. Gate electrode 9 of transistor 7 is not common to gate electrode 11 of transistor 8, as is common of such inverters configurations. Pull-up transistor 7 is driven directly and immediately in response to the input signal on line 2 by inverter amplifier 12. In contrast, the pull-down transistor 8 is driven directly during the low to high transitions of the input signal but is incrementally enabled during the high to low transitions. The conduction rate of pull-down transistor 8 during the latter noted high to low transition is regulated by controlling the rate of change of the voltage on capacitively loaded node 13 common to gate electrode 11 of transistor 8.

As embodied in FIG. 1, the enablement of pull-down transistor 8 during the high to low transition is accomplished in three relatively independent operational intervals individually dominated by three functional groupings of elements in the composite circuit 1. The first operational interval of the controlled enablement of pull-down transistor 8 is characterized by a relatively large current flow to charge effective capacitance 25 of node 13 and a duration which extends until the voltage on the node approaches approximately half the internal power supply voltage $V_{DD}$. As the voltage on node 13 approaches half the supply voltage the magnitude of current flow decreases nonlinearly to a second relatively constant but significantly lower, rate defining the second operation interval. During these first two time intervals, the voltage on node 13, common to gate electrode 11 of field effect transistor 8, increasingly enables transistor 8 to conduct and pull node 3 toward ground potential. Recall that series connected pull-up transistor 7 was made nonconductive immediately following the downward transition of the input signal on line 2. As the output pad voltage on node 3 approaches the ground level, node 13 is given a third time interval contribution of current, at a relatively significant rate, to fully pull up node 13 and thereby fully enable the pull-down operation of transistor 8

Figure 2:
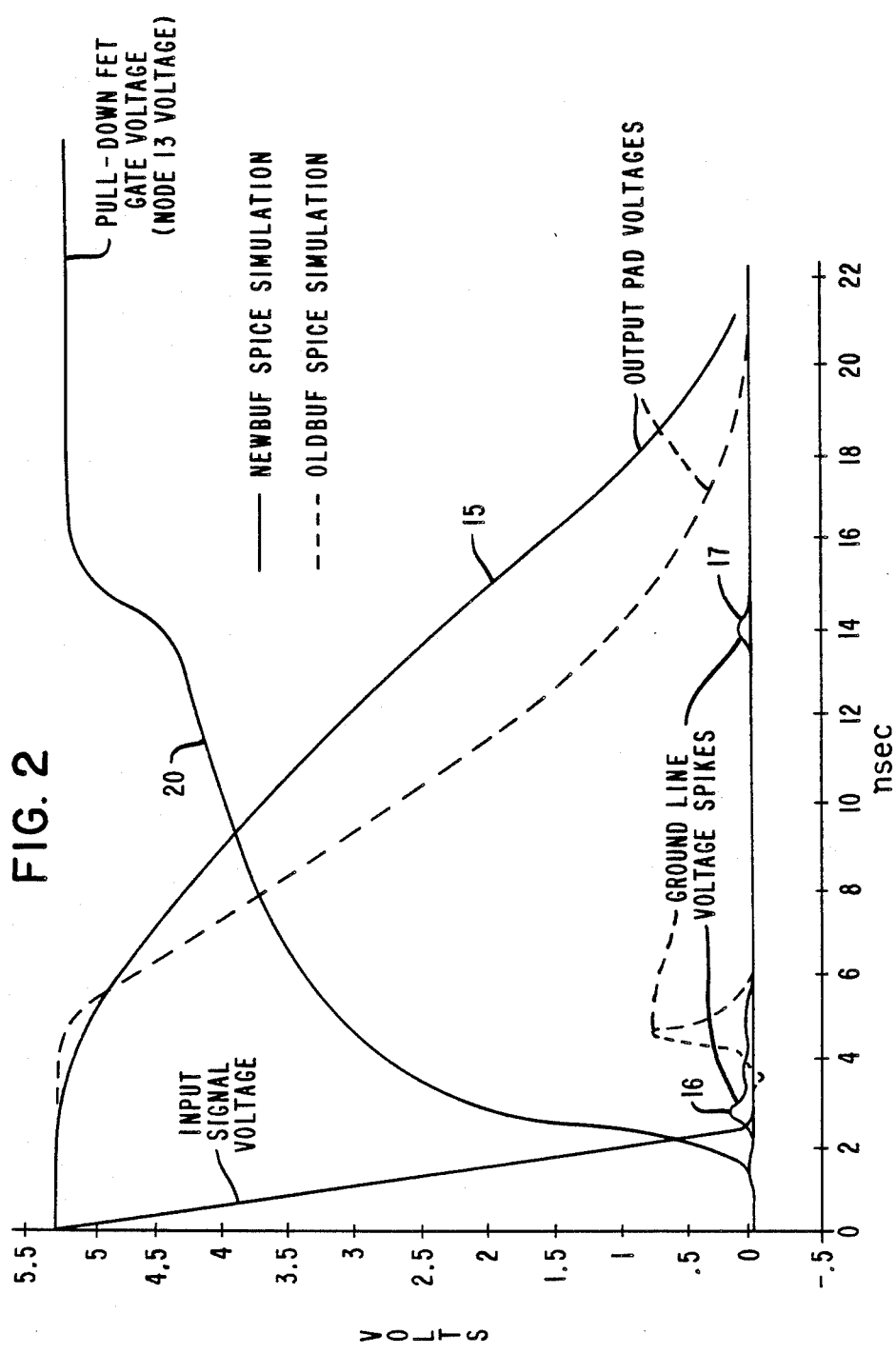
FIG. 2 illustrates representative voltage waveforms comparing the performance of the prior art with that of the present invention.

The effects of the operating sequence described above are best understood by considering the set of exemplary waveforms depicted in FIG. 2 of the drawings. The waveforms are simulation results using SPICE software of commercially acknowledge credibility. The dashed lines represent voltages generated by an old buffer design of comparable output capability. Though the output pad voltage transition rate of the old design was slightly faster, the ground line voltage spike was significantly greater. The higher voltage spike level is sufficient to inadvertently trigger sensitive logic devices, or at minimum materially degrade the noise margin of the integrated circuit device. Furthermore, it should be apparent that simultaneous switching of multiple comparably loaded out pad drivers would undoubtedly produce a cumulative effect on the ground line In contrast, the present circuit 1 (FIG. 1) provides an output pad voltage transition waveform 15 which exhibits a more controlled rate of change and a correspondingly lower ground line voltage spike pattern dominated by peaks 16 and 17. The effects of the time segmented currents which contribute to the potential on node 13, and gate electrode 11 of pulldown transistor 8, are shown by plot 20 in FIG. 2. Following the high to low transition of the input signal voltage from 5.25 volts to ground potential, waveform 20 shows a rapid initial rise of the node 13 voltage to approximately half the supply voltage. At approximately 3 nanoseconds the rate of rise of the node 13 voltage decreases significantly and continues thereafter at a relatively moderate rate until approximately 14 nanoseconds elapse. Thereafter, the voltage again rises abruptly until it reaches the supply voltage level of 5.25 volts. The combined effect of immediately switching pull-up transistors 7 in FIG. 1, while selectively controlling the rate of change of voltage applied to the gate electrode 11 of pull-down transistor 8, is a nominal 3 nanosecond delay in the fall time of the output pad voltage. However, note that the ground line voltage spikes 16 and 17 are suppressed to remain materially below levels which would unintentionaly enable field effect or bipolar transistor logic circuits.

Attention is again directed to FIG. 1 for consideration of the structural elements which contribute to the segmented enablement and ground line voltage spike suppression. The asymmetric operation of the circuit in FIG. 1 is best understood by considering the individual effects of the two input signal transitions. When the input signal transitions from an initial low level to a concluding high voltage level, output pad node 3 is expected to follow by having pull-down transistor 8 become nonconductive and pull-up transistor 7 become conductive. The absence of any rate of change control for the low to high transition is evidenced by the direct connection of input line 2 to the gate electrode of n-channel transistor 14, which transistor 14 immediately pulls node 13 to ground and thereby disables output pad pull-down transistor 8. Amplifier 12 concurrently inverts the low to high transitioning input signal and enables output pad pull-up transistor 7. Output pad node 3 is thereby pulled high with no compensation for voltage spikes.

In contrast, and consistent with the features of the present invention, the high to low transition of the input voltage on line 2 produces a controlled rate of change in the current conduction characteristics of pull-down transistor 8 as affects the voltage on output pad node 3. The transit on of the input line voltage from a high level to the low level is inverted immediately by amplifier 16 and in succession used to enable n-channel transistor 17. Transistor 17 is designed to be capable of conducting relatively large currents in comparison to concurrently enabled and parallel connected p-channel transistor 18. Note also that p-channel transistor 19, with moderate to high current conduction capacity, is also enabled coincident with the high to low transition of the input line 2. However, the temporary and residual high voltage state on output pad node 3 acting through feedback inverter amplifiers 21 and 22 prevents current flow through transistor 19 by disabling series connected p-channel transistor 23.

The three segments of the circuit in FIG. 1 which materially define the operational characteristics of the three time intervals depicted by waveform 20 in FIG. 2 are defined by dashed blocks 24, 26 and 27. Transistor 17 in block 24 provides the initial high rate of change of voltage on node 13 by saturated conduction of current until the node 13 voltage approaches half the power supply voltage $V_{DD}$. Thereafter, the relatively low rate of change time interval is defined by the limited conduction gate of transistor 18 in block 26. The concluding and rapid increase in the node 13 voltage is produced by the circuitry in block 27. As the output pad node 3 voltage reaches the low binary level, transistor 23 is enabled to conduct at a relatively high rate through previously enabled transistor 19 to fully pull node 13 to $V_{DD}$.

A significant and unique aspect of the interaction o functional blocks 24, 26 and 27 is attributable to threshold loss and body effect current limitations in transistor 17 of block 24. Transistor 17 is an enhancement type n-channel device which when initially enabled, with node 13 at near ground potential operates in a saturated mode. The relatively large width/length channel dimension of transistor 17 provides a significant saturation mode current to charge distributed capacitance 25 of node 13. Since the source electrode of transistor 17 is connected to node 13 rather ground potential, the conduction characteristics of transistor 17 are also affected by the voltage on node 13. Therefore, as the voltage on node 13 increases above ground and approaches approximately half the 5.25 volt level of the supply voltage $V_{DD}$, threshold loss and body effect current limitations on transistor 17 decrease the rate of conduction. Transistor 17 is designed to approach its linear region of operation as node 13 approaches half the power supply voltage. When the potential on node 13 rises above half the power supply voltage transistor 17 is cut off. Thereafter, the rate of change of voltage on node 13 is dominated by the second functional block 26 comprised as embodied by an enabled but relatively small current capacity transistor 18.

The time interval characterized by a flow rate of change of potential on node 13 is dominated by the effects of the limited amount of current furnished by transistor 18 and continues until transistor 8 is able to pull node 13 below the voltage level defined as the low binary state threshold. Thereupon, inverter 21 switches to a high level and successively switches inverter 22 to a low level. Series connected transistors 19 and 23, of moderate current conduction capability, are then both enabled to furnish current which rapidly pulls node 13 to the 5.25 volt level of the supply voltage $V_{DD}$. This last described functional group 27 is therefore feedback responsive, based upon the combination of the appropriate input voltage at line 2 and the appropriate load influenced level of the voltage on output pad node 3.

The voltage on gate 11 of transistor 8, which gate voltage establishes the magnitude of the current conduction through transistor 8, is thereby the result of the multiple and combined actions of the three blocks. The first functional block 24 is cut off at approximately half the supply voltage. The second functional block 26 provides a limited current to constrain the rate of change of voltage during the intermediate time interval. And lastly, the concluding functional block 27 fully enables transistor 8 after node 3 approaches the defined binary state level.

Circuit 1 in FIG. 1 does not suppress voltage spikes on the power supply voltage line during pull-up operations, as it does with respect to suppressing ground line voltage spikes during the pull-down operation. A similar but complementary circuit for controlling pull-up transistor 7 can be provided to suppress the power supply line spikes. Circuit elements functionally complementary to the devices in blocks 24, 26 and 27 would be configured and connected to similarly control the enablement of pull-up transistor 7.

It will no doubt be understood by one skilled in the art that the sizes of transistors 17, 18 and 19/23 should for optimum performance be selected to match the effective parasitic and distributed capacitance on node 13 in consideration of the interaction of pull-down transistor 8 with the anticipated load. For instance, if the capacitance on node 13 is relatively small and transistor 8 is relatively large, the rate of rise of the voltage on node 13 and associated rate of current flow though transistor 8 may produce ground line voltage spikes larger than desired. For a nominal design, capacitance 25 is 1.6 picofarads and transistors 8 and 17 have threshold voltages of approximately 0.8 volts. Representative relative channel width/length ratios for transistors 17, 18 and 19/23 is nominally in the range of 4.5:1:9, which nominally translates to a 9:1:9 relative ratio of currents through the n and p-channel transistors.

The onset of the threshold loss and body effect current limitations on n-channel field effect transistor 17 is adjustable, depending primarily on the magnitude of the threshold voltage designed into field effect transistor 17. The shape of wave form 20 in FIG. 2 was based upon a simulation utilizing a 0.8 volt threshold for transistor 17. Raising the threshold voltage would lower the break point of waveform 20 from the nominal 2.5 volts to a lesser value. In the alternative, reducing the threshold voltage of transistor 17 would increase the level at which knee or break point occurs.

Figure 3:
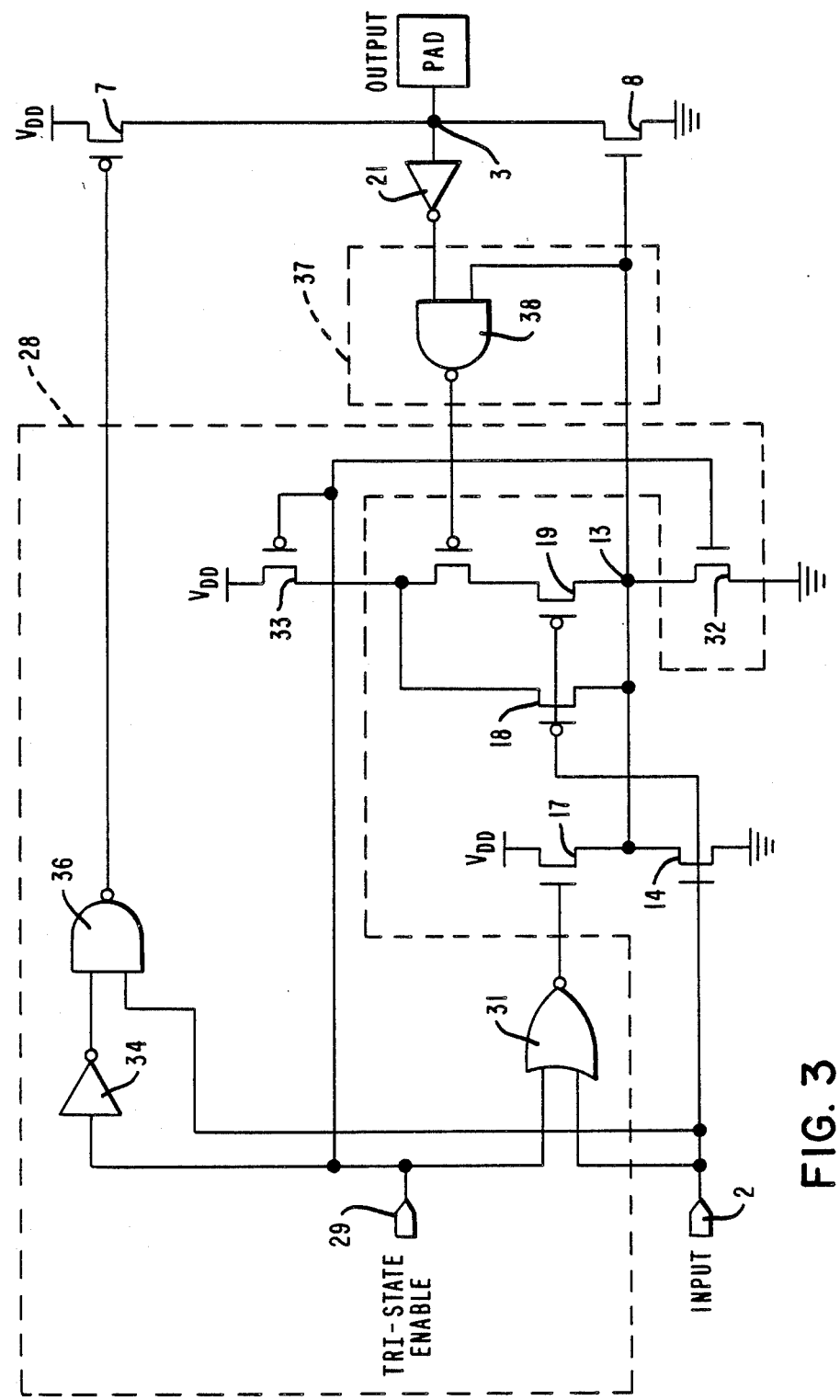
FIG. 3 schematically illustrates a refined, tri-state embodiment of the invention.

Contemporary output pad driver circuits are often required to provide tri-state operational capability, wherein the third state is a floating or high impedance isolated output pad node 3. Conventionally this is accomplished by disabling both the pull-up and pull-down transistors of the CMOS inverter. A representative tri-state embodiment of the present invention is depicted in FIG. 3 of the drawings. The circuit in FIG. 3 adds to the functional elements in FIG. 1 the devices and logic within the region defined by dashed perimeter lines 28 and 37.

A high voltage level signal on tri-state enable line 29 simultaneously disables pull-up transistor 7 and pull-down transistor 8, irrespective of the level of the signal on input line 2. For instance, when tri-state enable line 29 is high the output of NOR gate 31 is low irrespective of the input line 2 signal. Transistor 17 is thus continuously disabled. Transistor 32, driven directly by tri-state enablement 29, ensures that node 13 is forced low so as to disable pull-down transistor 8. Any residual or leakage charge on node 13 is thereby dissipated. The high voltage level on tri-state enable line 29 also disables transistor 33, thereby effectively disconnecting the source of current to any combination of the remaining transistors 18, 19 and 23 supplying node 13. Consequently, whenever the tri-state enable line 29 is in the high state, output pad pull-down transistor 8 is disabled.

A similar disablement is effectuated on output pad pull-up transistor 7, implemented a simpler fashion because the turn-on rate of pull-up transistor 7 is not controlled, as now embodied. The presence of a high voltage level signal on tri-state enable line 29 produces following inversion by amplifier 34 a low input to NAND gate 36. The output of NAND gate 36 is therefore at a high level irrespective of the input signal coming from line 2. Consequently, output pad pull-up transistor 7 is held disabled.

Analysis of the conditions within the various logic blocks and functional devices when the tri-state enable signal on line 29 is at a low level will confirm that the operation reverts to that representative of the circuit in FIG. 1.

The embodiment depicted in FIG. 3 incorporates a further and beneficial refinement defined by the logic in block 37. Functionally, gate 38 prevents premature enablement of transistor 23. Were it not for logic gate 38, an immediate and unintended enablement of transistor 23 could occur immediatley following the removal of the tri-state enable signal. NAND gate 38 receives logic state signals from both output pad node 3 and the pull-down transistor 8 gate electrode node 13. Logic gate 38 requires that the voltage on node 13 be brought to a high level before a low level voltage on node 3 can enable transistor 23.

The tri-state operable circuitry depicted in FIG. 3 controls the rate of rise of the voltage on node 13 to limit the current through transistor 8 and thereby suppress ground line voltage spikes. It is feasible and within the abilities of one skilled in the art to arrange a complementary circuit, in lieu of inverter 34 and NAND gate 36, which provides a similar controlled rate of enablement of pull-up transistor 7. Thereby, power supply line voltage spike suppression can also be implemented in a tri-state configuration. The relative dimensions of the various devices must of course be adjusted to compensate for the lower mobility of p-type transistors.

It will be understood by those skilled in the art that the embodiment set forth hereinbefore are merely exemplary of the numerous arrangements by which the invention may be practiced, and as such may be replaced by an equivalents without departing from the invention which will now be defined by appended claims.

What is claimed is:

1. A CMOS circuit for providing a controlled transition rate output voltage at as output node in response to an input voltage on an input node and operable from common power supply and ground nodes, comprising:
   first and second field effect transistors of respective first and second impurity type connected in electrical series to have the first transistor connected at one source/drain to the power supply node, the second transistor connected as one source/drain to the ground node, and the common connection of the remaining source/drains defining the output node;
   a third field effect transistor of the second impurity type having a first source/drain connected to the power supply node and the second source/drain connected to the gate electrode of the second transistor and having its gate electrode connected to receive input node voltage based signals, the third transistor characterized in that the current conducted through the third transistor cuts off when its second source/drain voltage reaches a material fraction of the power supply node voltage;
   a fourth field effect transistor of first impurity type connected between the power supply node and gate electrode of the second transistor and having its gate electrode connected to receive input node voltage based signals, the fourth field effect transistor characterized by materially lower current conduction capability than the third transistor;
   means for pulling the gate electrode of the second transistor to the voltage of the power supply node responsive to the output node voltage approaching the ground node voltage; and
   means for enabling the first field effect transistor to a conductive state complementary to that of the second field effect transistor in response to input node voltage based signals.

2. The apparatus recited in claim 1, further including:
   first logic means connected to receive the input node voltage and a tri-state enable node voltage for selectively disabling the first and second field effect transistors when a tri-state condition is defined.

3. The apparatus recited in claim 2, further including:
   second logic means connected to receive the output node voltage and second field effect transistor gate electrode voltage for selectively disabling the means for pulling the gate electrode of the second transistor during the presence of a tri-state enable node voltage.

4. The apparatus recited in claim 1, further including:
   fifth field effect transistor connected to conduct between the gate electrode of the second transistor and the ground node in response to an input node voltage on the gate electrode.

5. The apparatus recited in claim 4, wherein the third field effect transistor is an enhancement operating mode device which exhibits threshold losses and body effect in transition from a saturated operating mode to cutoff as the voltage on the gate electrode of the second transistor approaches half the power supply node voltage.

6. The apparatus recited in claim 5 wherein the relative channel width/length ratios for the third, fourth and fifth transistors are approximately 4.5:1:9.

7. A buffer circuit for receiving ah input node voltage and generating a controlled rate of change of output node voltage, comprising:

an inverter stage having first and second field effect transistors connected in series between a power supply voltage and ground, with the output node common to an electrical connection between the transistors;

means for generating a first electrical current to drive the second inverter field effect transistor and suitable to provide a high rate of change of voltage, between zero volts and approximately half the power supply voltage, to the gate electrode of the second inverter field effect transistor;

means for generating a second electrical current to drive the second inverter field effect transistor and suitable to provide a low rate of change of voltage, for the majority of the remaining half of the power supply voltage, to the gate electrode of the second inverter field effect transistor;

means for pulling the gate electrode of the second inverter field effect transistor to the full potential of the power supply voltage; and means for selectively disabling the first inverter field effect transistor prior to enabling the second inverter field effect transistor.

8. The apparatus recited in claim 7, wherein the means for generating a first electrical current is a high current field effect transistor which is subject to threshold loss and body effect current cutoff responsive to the voltage on the gate electrode of the second inverter field effect transistor.

9. The apparatus recited in claim 8, wherein the means for generating a second electrical current is a low current field effect transistor connected in electrical parallel with the means for generating a first electrical current.

10. The apparatus recited in claim 9, wherein the means for pulling the gate electrode of the second inverter field effect transistor to the full potential of the power supply voltage is high current field effect transistor enabled responsive to the magnitude of the voltage on the output node.

* * * * *

UNITED STATES PATENT AND TRADEMARK OFFICE
CERTIFICATE OF CORRECTION

PATENT NO. : 4,880,997

DATED : November 14, 1989

INVENTOR(S) : David P. Steele

It is certified that error appears in the above-identified patent and that said Letters Patent is hereby corrected as shown below:

Column 8, line 18, delete the word "as" and substitute --an--.

Column 8, line 25, delete the word "as" and substitute --at--.

Signed and Sealed this

Sixteenth Day of April, 1991

Attest:

HARRY F. MANBECK, JR.

Attesting Officer

Commissioner of Patents and Trademarks